United States Patent
De Silva et al.

(10) Patent No.: US 10,678,135 B2
(45) Date of Patent: Jun. 9, 2020

(54) SURFACE TREATMENT OF TITANIUM CONTAINING HARDMASKS

(71) Applicant: International Business Machines Corporation, Armonk, NY (US)

(72) Inventors: Ekmini A. De Silva, Slingerlands, NY (US); Dario Goldfarb, Dobbs Ferry, NY (US); Indira Seshadri, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 127 days.

(21) Appl. No.: 15/848,495

(22) Filed: Dec. 20, 2017

(65) Prior Publication Data
US 2019/0189429 A1 Jun. 20, 2019

(51) Int. Cl.
| | |
|---|---|
| *G03F 7/11* | (2006.01) |
| *H01L 21/027* | (2006.01) |
| *H01L 21/033* | (2006.01) |
| *H01L 21/311* | (2006.01) |
| *G03F 7/42* | (2006.01) |
| *G03F 7/16* | (2006.01) |
| *G03F 7/09* | (2006.01) |
| *G03F 7/30* | (2006.01) |
| *H01L 21/3213* | (2006.01) |

(52) U.S. Cl.
CPC ............... *G03F 7/11* (2013.01); *G03F 7/094* (2013.01); *G03F 7/165* (2013.01); *G03F 7/422* (2013.01); *G03F 7/425* (2013.01); *H01L 21/0274* (2013.01); *H01L 21/0332* (2013.01); *H01L 21/31111* (2013.01); *H01L 21/31133* (2013.01); *G03F 7/30* (2013.01); *H01L 21/32134* (2013.01)

(58) Field of Classification Search
CPC ........................................................ G03F 7/09
See application file for complete search history.

(56) References Cited

U.S. PATENT DOCUMENTS

| | | | |
|---|---|---|---|
| 7,309,658 B2 | 12/2007 | Lazovsky et al. | |
| 8,124,485 B1 | 2/2012 | Goldfarb et al. | |
| 8,198,191 B2 | 6/2012 | Cho et al. | |
| 8,652,964 B2 | 2/2014 | Baker et al. | |
| 8,883,646 B2 | 11/2014 | Huang et al. | |
| 9,345,149 B2 | 5/2016 | Wei et al. | |
| 9,646,932 B2 | 5/2017 | Peng et al. | |
| 10,082,736 B2 * | 9/2018 | De Silva | G03F 7/2004 |
| 10,254,652 B2 * | 4/2019 | De Silva | G03F 7/11 |
| 2009/0304914 A1 | 12/2009 | Nalla et al. | |
| 2015/0132947 A1 | 5/2015 | Peng et al. | |

OTHER PUBLICATIONS

A. De Silva et al., "Development of TiO2 containing hardmasks through PEALD deposition," Proc. of SPIE, 2017, vol. 10146, 1014615, 11 pages.
Ekmini A. De Silva et al."Surface Treatment of Titanium Containing Hardmasks", U.S. Appl. No. 16/699,942, filed Dec. 2, 2019.
List of IBM Patents or Patent Applications Treated as Related; (Appendix P), Date Filed Dec. 2, 2019; 2 pages.

* cited by examiner

*Primary Examiner* — Kathleen Duda
(74) *Attorney, Agent, or Firm* — Cantor Colburn LLP; Vazken Alexanian

(57) ABSTRACT

A surface treatment composition and methods for improving adhesion of an organic layer on a titanium-containing hardmask includes forming a self-assembled monolayer on a surface of the titanium-containing hardmask prior to depositing the organic layer. The self-assembled monolayer is formed from a blend of alkyl phosphonic acids of formula (I): $X(CH_2)_nPOOH_2$ (I), wherein n is 6 to 16 and X is either $CH_3$ or COOH, wherein a ratio of the methyl terminated ($CH_3$) alkyl phosphonic acid to the carboxyl terminated (COOH) alkyl phosphonic acid ranges from 25:75 to 75:25.

17 Claims, 2 Drawing Sheets

SURFACE TREATMENT OF TITANIUM CONTAINING HARDMASKS

BACKGROUND

The present invention generally relates to fabrication methods and resulting structures for semiconductor devices. More specifically, the present invention relates to surface treatment of titanium-containing hardmasks and compositions for improving organic layer adhesion on titanium-containing hardmasks.

Surface treatments are known in semiconductor manufacture to improve adhesion of an organic layer to an underlying titanium containing hardmask. For example, titanium oxide surfaces can be treated with hexamethyldisilazane (HMDS) to improve adhesion of an organic layer coated thereon but has had limited success as lift off and adhesion failure is often observed. Additionally, organic underlayers such as a bottom antireflective coatings (BARC) have been utilized as an adhesion promoter. However, the use of BARCs can complicate stack patterning as the BARC needs to be selectively opened relative to the photoresist.

SUMMARY

Embodiments of the present invention are generally directed to semiconductor structures and methods for forming the semiconductor structures. A non-limiting example method of fabricating the semiconductor device according to embodiments of the invention includes applying a self-assembled monolayer to a titanium containing hardmask layer overlaying a substrate. The self-assembled monolayer includes a blend of alkyl phosphonic acids of formula (I): $X(CH_2)_nPO(OH)_2$ (I), wherein n is 6 to 16 and X is either $CH_3$ or COOH, and wherein a ratio of the methyl terminated ($CH_3$) alkyl phosphonic acid to the carboxyl terminated (COOH) alkyl phosphonic acid ranges from 25:75 to 75:25. The method further includes depositing an organic layer onto the self-assembled monolayer.

A non-limiting example method of fabricating the semiconductor device according to embodiments of the invention includes forming a self-assembled monolayer on a surface of a titanium-containing hardmask layer provided on a substrate. The self-assembled monolayer is a blend of alkyl phosphonic acids of formula (I): $X(CH_2)_nPO(OH)_2$ (I), wherein n is 6 to 16 and X is either $CH_3$ or COOH, wherein a ratio of the methyl terminated ($CH_3$) alkyl phosphonic acid to the carboxyl terminated (COOH) alkyl phosphonic acid ranges from 25:75 to 75:25. The method further includes depositing a photosensitive resist layer onto the self-assembled monolayer; and lithographically patterning and developing the photosensitive resist layer to form at least one opening therein. The method further includes transferring the at least one opening into the self-assembled monolayer and titanium containing hardmask. The at least one opening in the self-assembled monolayer and titanium containing hardmask is transferred into an underlayer, and the self-assembled monolayer and titanium containing hardmask are wet stripped from the substrate.

A non-limiting example surface treatment composition for improving adhesion of an organic layer to a titanium-containing hardmask according to embodiments of the invention includes a blend of alkyl phosphonic acids of formula (I): $X(CH_2)_nPO(OH)_2$ (I), wherein n is 6 to 16 and X is either $CH_3$ or COOH, wherein a ratio of the methyl terminated ($CH_3$) alkyl phosphonic acid to the carboxyl terminated (COOH) alkyl phosphonic acid ranges from 25:75 to 75:25. The surface treatment composition also includes a solvent.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
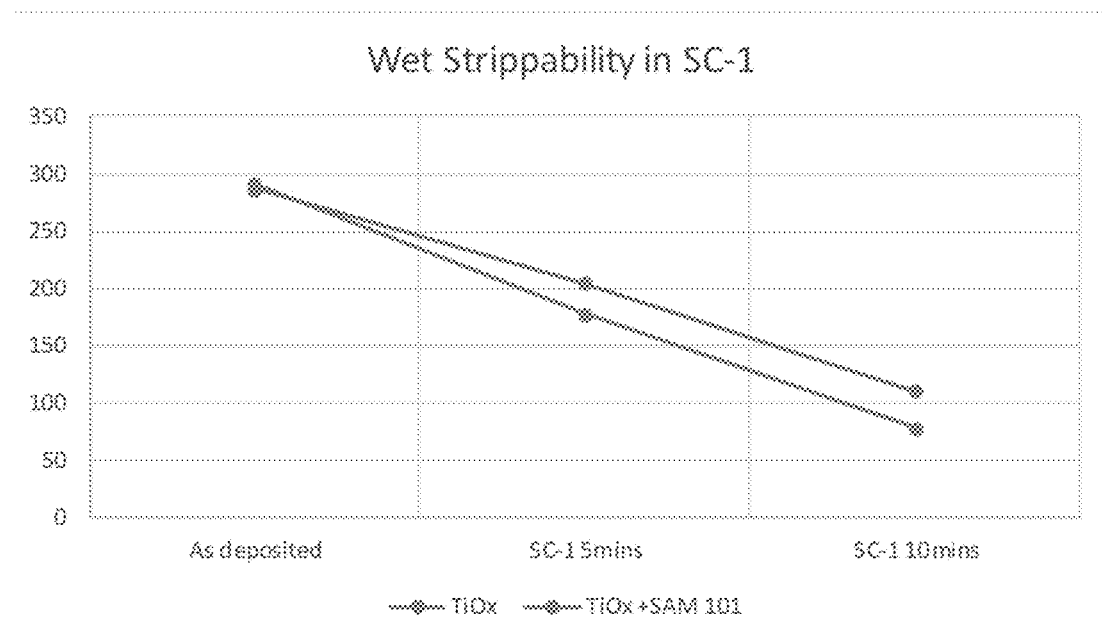
FIG. 1 graphically illustrates wet strippability of a patterning stack including a self-assembled monolayer on a titanium-containing hardmask material according to embodiments of the invention.

Methods for patterning on a titanium-containing hardmask and compositions for improving the adhesion of an organic layer on the titanium-containing hardmasks in accordance with embodiments of the invention generally include deposition of a self-assembled monolayer (SAM) onto a surface of the titanium-containing hardmask followed by deposition of the organic layer on the SAM/titanium-containing hardmask layers. As will be discussed in greater detail herein, adhesion of the organic layer onto the SAM/titanium-containing hardmask layer is markedly improved and can subsequently be removed by a wet stripping process during removal of the titanium-containing hardmask. The organic layer is not intended to be limited and can be, for example, a photosensitive resist layer, an organic planarizing layer, or the like.

Detailed embodiments of the structures of the present invention are described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

In one or more embodiments, the present invention generally includes applying a surface treatment composition to a surface of a titanium-containing hardmask material followed by deposition of an organic layer such as a photoresist. The surface treatment composition generally includes a self-assembled monolayer (SAM) of an organic molecule in a suitable solvent that is configured to improve organic layer adhesion to the surface of the titanium-containing hardmask. The SAMs form spontaneously on the titanium-containing hardmask surfaces by adsorption and are organized into more or less large ordered domains. The SAMs are created by the chemisorption of "head groups" onto a substrate from a liquid phase followed by a slow organization of "tail and terminal functional groups". The "head groups" assemble together on the substrate, while the tail and terminal functional groups assemble far from the substrate. Areas of close-packed molecules nucleate and grow until the surface of the substrate is covered in a single monolayer.

In one or more embodiments according to the present invention, the SAM is a blend of alkyl phosphonic acids in a suitable solvent, wherein the "head group" is a phosphonate, the tail group is an alkyl chain, and the terminal functionality of the alkyl phosphonic acids is balanced between $CH_3$ and COOH functional groups, which can be tailored to match the hydrophobicity of the organic layer such as a photoresist intended to be utilized during the manufacture of the semiconductor device. As defined herein, the term "alkyl", alone or in combination with any other term, refers to a straight-chain or branch-chain saturated aliphatic hydrocarbon radical containing a number of carbon atoms from 6 to 16, preferably from 6 to 12 and more preferably from 6 to 8 carbon atoms. Examples of alkyl radicals include, but are not limited to, methyl, ethyl, n-propyl, isopropyl, n-butyl, isobutyl, sec-butyl, tert-butyl, pentyl, isoamyl, n-hexyl and the like.

In one or more embodiments of the invention, the SAM is of formula (I): $X(CH_2)_nPO(OH)_2$ (I), wherein n is 6 to 16 and X is either $CH_3$ or COOH. As noted above, surface treatment includes applying a blend of the alkyl phosphonic acids to the surface of the titanium-containing hardmask. In one or more embodiments of the invention, the ratio of the methyl terminated ($CH_3$) alkyl phosphonic acids to the carboxyl terminated (COOH) alkyl phosphonic acids ranges from 25:75 to 75:25. In one or more other embodiments of the invention, the ratio of the methyl terminated alkyl phosphonic acid to the carboxyl terminated phosphonic acids ranges from 30:70 to 70:30; and in still one or more other embodiments of the invention, the ratio of the methyl terminated alkyl phosphonic acid to the carboxyl terminated phosphonic acids ranges from 40:60 to 60:40.

Exemplary types of carboxyl-terminated alkyl phosphonic acids include, without limitation, 11-phosphonoundecanoic acid (n=10), 16-phosphonohexadecanoic acid (n=15), and the like. Exemplary alkyl phosphonic acid include, without limitation, n-decylphophoinic acid (n=9), n-hexylphosphonic acid (n=5), and the like.

The casting solvent can be any solvent known in the art that effectively solubilizes the alkyl phosphonic acid. The solvent can be, for example, any solvent conventionally used in spin coat methods, e.g., ethers, glycol ethers, aromatic hydrocarbons, ketones, and esters commonly used for such a purpose. Some particular examples of casting solvents include 3-pentanone, methyl isobutyl ketone (MIBK), propylene glycol methyl ether (1-methoxy-2-propanol), methyl cellosolve (2-methoxyethanol), butyl acetate, 2-ethoxyethanol, propylene glycol methyl ether acetate (PGMEA), propylene glycol propyl ether (1-propoxy-2-propanol, Dowanol PnP), 4-heptanone, 3-heptanone, 2-heptanone, N,N-dimethylformamide, N,N-dimethylacetamide, anisole, ethyl lactate, cyclohexanone, cellosolve acetate (ethylene glycol ethyl ether acetate), diglyme (2-methoxy ethyl ether), ethoxyethylpropionate (EEP), dimethyl sulfoxide, di(propylene glycol) methyl ether (DOWANOL®), di(ethylene glycol) methyl ether, diethylmalonate, diethylene glycol monobutyl ether (DEGBE) and gamma-butyrolactone (GBL). Moreover, any suitable combination of such solvents can be used, e.g., a combination of EEP and GBL.

The present surface treatment changes (lowers) the surface energy (raises the water contact angle) of the titanium-containing hardmask layer by applying the SAM as described above so as to make the surface more compatible with a subsequently applied organic layer, such as a photosensitive resist layer, an organic planarizing layer or the like. As surface energy is often difficult to measure, surrogate measurements, such as water contact angles, are typically used. The determination of water contact angles is well-known, and a suitable method uses a Kruss drop shape analyzer Model 100, using deionized ("DI") water and a 2.5 µL drop size. Following treatment with the present SAM compositions, the titanium containing hardmask surface typically has a water contact angle of 60 to 80°, and in one or more other embodiments of the invention has a water contact angle from 60 to 70°. Following treatment with the present SAM compositions, the surface has a surface energy that substantially matches that of a subsequently applied organic layer, that is, the surface energy of the treated hardmask layer should be within 20% of the surface energy of a subsequently applied organic layer, and preferably within 10%.

The titanium-containing hardmask is not intended to be limited and can include titanium atoms and one or more of silicon, oxygen or carbon atoms. By way of example, the titanium-containing hardmask can include TiSi, TiO, $TiO_2$, TiC, TiSiC, TiSiO, TiSiCO, TiOC, TiSiN, TiON, TiCN, TiSiCN, TiSiON, TiSiCON, TiOCN, or the like typically deposited by chemical vapor deposition (CVD) methods as is known in the art. In one or more embodiments of the invention, the titanium-containing hard mask includes at least about 25 atomic % titanium. In one or more embodiments of the invention, the titanium-containing hard mask includes at least about 30, 35, 40, 45, 50, 55, 60, 65, 70 or 75 atomic percent titanium. In one or more embodiments of the invention, the atomic percent of any of the silicon, carbon, nitrogen or oxygen atoms in the hard mask is greater than or equal to about 20, 25, 30, 35, 40, 45 or 50 atomic percent.

As noted above, direct application of an organic layer onto a titanium-containing hardmask is challenging because of lift-off and/or adhesion failure. However, patterning an organic layer such as a photosensitive resist layer directly on the SAM/titanium-containing hardmask can advantageously simplify the patterning scheme.

Once the photosensitive resist layer is deposited onto the SAM/titanium-containing hardmask, the photosensitive resist layer is lithographically patterned to expose selected portions of the SAM/titanium-containing hardmask. The photosensitive resist layer can be formed using conventional deposition techniques such chemical vapor deposition, plasma vapor deposition, sputtering, dip coating, spin-on coating, brushing, spraying and other like deposition techniques can be employed. Following formation of the photosensitive resist layer, the photosensitive resist layer is exposed to a desired pattern of radiation such as 193 nm, X-ray radiation, extreme ultraviolet (EUV) radiation, electron beam radiation or the like. Illustrative examples of 193 nm photosensitive resist layers include a methacrylate polymer, a phenolic based polymer or a copolymer thereof. Other types of organic photoresists such as, for example, polyesters can also be employed. The photosensitive layer can be at a thickness of 30 nm to 300 nm, although lesser and greater thicknesses can also be employed.

The exposed photosensitive resist layer can be developed utilizing a conventional resist development process to expose selected portions of the SAM/titanium-containing hardmask. After the development step, an etching step can be performed to transfer the pattern from the patterned photosensitive resist layer into the SAM/titanium-containing hardmask and expose selected portions of an underlayer surface. The etching step used in forming the at least one opening can include a dry etching process (including, for example, reactive ion etching, ion beam etching, plasma etching and laser ablation), a wet chemical etching process, or any combination thereof. A portion of the photosensitive resist layer can also be removed during the etching process.

The underlayer can include an organic planarization layer that is commonly utilizing in multilayer lithographic processes such as a trilayer lithography, which generally employs organic/inorganic/organic layers to produce subground rule patterns of less than 40 nm of various structures and features such as gate structures. An organic planarizing material layer such as an amorphous carbon layer is often used in order to transfer a composite image of two independent images. The titanium-containing hardmask as discussed above functions as a hardmask during the etch transfer step into the organic planarizing layer. The third layer is typically an organic photosensitive resist layer. Trilayer processing thus offers the opportunity for a significant reduction in photoresist film thickness and provides a potential solution to the familiar aspect ratio problem encountered during wet development of 193-nm single layer resists.

The exposed surfaces of the organic planarization layer can anisotropically etched utilizing a dry etch process, e.g., reactive ion etch using, for example, $CF_4$ based chemistry. The dry etch process is selective to the organic planarization layer, wherein the titanium-containing hardmask has a markedly lower etch rate.

Once the pattern is transferred into the organic planarization layer, the substrate is then subjected to a wet stripping process to selectively remove the SAM and the titanium-containing hardmask from the underlying organic planarization layer. An exemplary wet stripping process is a standard clean wet etching process referred to by those skilled in the art as SC-1, which utilizes an aqueous solution including ammonium hydroxide ($NH_4OH$), hydrogen peroxide ($H_2O_2$), and water ($H_2O$). The ratio of $NH_4OH:H_2O_2:H_2O$ is typically 1:2:10, respectively. Advantageously, the wet strippability of the SAM/titanium-containing layer in the SC-1 wet etchant does so without damaging the substrate and without the need for a dry etch process.

The substrate is typically exposed to the wet etchant for a period of time (typically, about 0.5 minutes to about 30 minutes) and at a temperature (about 25° C. to about 70° C.) effective to strip the SAM and the titanium-containing hardmask selectively relative to the surrounding structures.

FIG. 1 graphically illustrates wet strippability of a patterning stack including a SAM formed on a titanium-containing hardmask. A titanium oxide layer including 30% titanium and 70% oxygen was deposited by CVD onto a substrate to a thickness of about 290 nm. A SAM of n-heptyl phosphonic acid (n=6) was formed on the hardmask, wherein the ratio of the terminal carboxyl group to the terminal methyl group was 75:25. Removal of the patterning stack in SC-1 after 5 minutes and after 10 minutes is shown.

Figure 2:
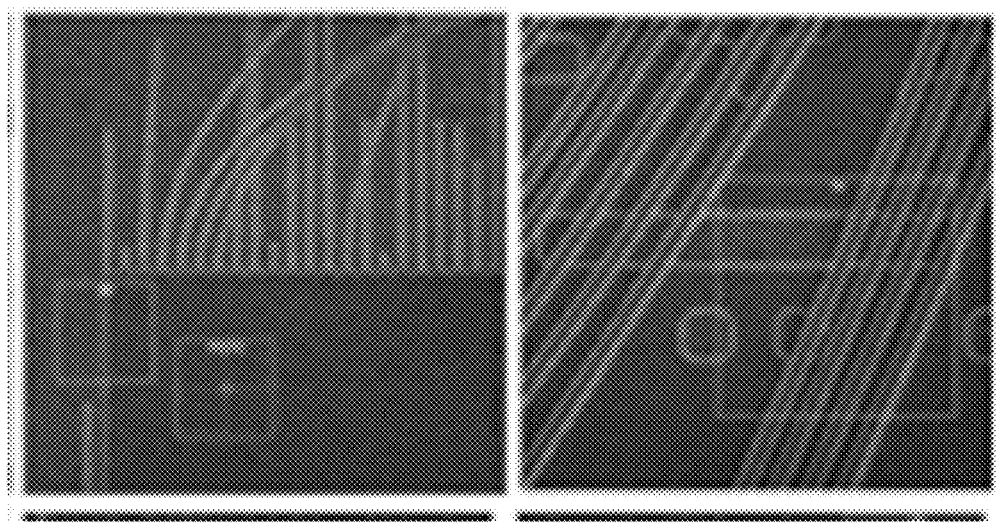
FIG. 2 depicts a scanning electron micrograph of a photosensitive resist layer disposed directly on a titanium-containing hardmask subsequent to patterning.

FIG. 2 provides micrographs of a Pi6 photoresist (Tokyo Ohka Kogya) deposited directly onto a titanium oxide layer including 30% titanium and 70% oxygen and lithographically patterned at 193 nm. Severe lift-off and adhesion failure of 80 nm line and spaces was observed.

Figure 3:
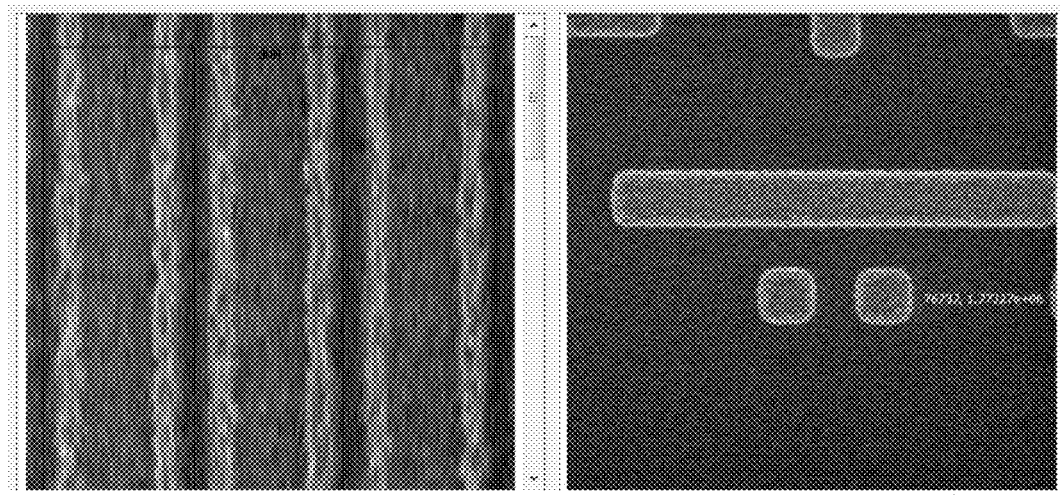
FIG. 3 depicts scanning electron micrographs of a photosensitive resist layer disposed on a self-assembled monolayer formed on a titanium-containing hardmask material subsequent to patterning according to embodiments of the invention.

FIG. 3 provides micrographs of a Pi6 photoresist (Tokyo Ohka Kogya) deposited directly onto a SAM/titanium oxide stack and lithographically patterned at 193 nm. The SAM was n-heptyl phosphonic acid (n=6), wherein the ratio of the terminal carboxyl group to the terminal methyl group was 75:25. The titanium oxide was 30% titanium and 70% oxygen deposited by CVD. After development, no adhesion failure was observed for the 80 nm line/space features.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method of fabricating a semiconductor device, the method comprising:
    applying a self-assembled monolayer to a titanium-containing hardmask layer overlaying a substrate, wherein the self-assembled monolayer comprises a blend of alkyl phosphonic acids of formula: $X(CH_2)_nPO(OH)_2$, wherein n is 6 to 16 and X is either $CH_3$ or COOH, wherein a ratio of the methyl terminated ($CH_3$) alkyl phosphonic acid to the carboxyl terminated (COOH) alkyl phosphonic acid ranges from 25:75 to 75:25; and
    depositing an organic layer onto the self-assembled monolayer.

2. The method of claim 1, wherein the organic layer comprises a photosensitive resist layer.

3. The method of claim 2, further comprising patterning and developing the photosensitive resist layer; transferring the pattern in the photosensitive resist layer into the titanium-containing hardmask layer; transferring the pattern in the titanium-containing hardmask layer into an underlayer; and simultaneously wet stripping the self-assembled monolayer and the titanium-containing hardmask layer from the substrate.

4. The method of claim 3, wherein wet stripping comprises applying an aqueous solution including ammonium hydroxide ($NH_4OH$), hydrogen peroxide ($H_2O_2$), and water ($H_2O$).

5. The method of claim 2, further comprising lithographically imaging and developing the photosensitive resist layer to form at least one opening exposing the self-assembled monolayer and titanium-containing hardmask; transferring the at least one opening into the self-assembled monolayer and titanium-containing hardmask to form the at least one opening in an underlying layer; and wet stripping the self-assembled monolayer and titanium-containing hardmask from the substrate.

6. The method of claim 1, wherein the organic layer comprises an organic planarizing layer.

7. The method of claim 1, wherein the titanium-containing hardmask layer comprises TiSi, TiO, $TiO_2$, TiC, TiSiC, TiSiO, TiSiCO, TiOC, TiSiN, TiON, TiCN, TiSiCN, TiSiON, TiSiCON, or TiOCN.

8. The method of claim 1, wherein n is within a range from 6 to 12.

9. The method of claim 1, wherein the self-assembled monolayer on the titanium containing hardmask layer provides a water contact angle within a range from about 60° to about 80°.

10. The method of claim 1, wherein the ratio of the methyl terminated ($CH_3$) alkyl phosphonic acid to the carboxyl terminated (COOH) alkyl phosphonic acid ranges from 40:60 to 60:40.

11. The method of claim 1, wherein the titanium-containing hard mask includes at least about 25 atomic % titanium.

12. A method of fabricating a semiconductor device, the method comprising:
    forming a self-assembled monolayer on a surface of a titanium-containing hardmask layer provided on a substrate, wherein the self-assembled monolayer is a blend of alkyl phosphonic acids of formula: $X(CH_2)_nPO(OH)$ $_2$, wherein n is 6 to 16 and X is either $CH_3$ or COOH, wherein a ratio of the methyl terminated ($CH_3$) alkyl phosphonic acid to the carboxyl terminated (COOH) alkyl phosphonic acid ranges from 25:75 to 75:25;

depositing a photosensitive resist layer onto the self-assembled monolayer;

lithographically patterning and developing the photosensitive resist layer to form at least one opening therein;

transferring the at least one opening into the self-assembled monolayer and titanium containing hardmask;

transferring the at least one opening in the self-assembled monolayer and titanium containing hardmask into an underlayer; and wet stripping the self-assembled monolayer and titanium containing hardmask from the substrate.

13. The method of claim 12, wherein the titanium-containing hardmask layer comprises TiSi, TiO, $TiO_2$, TiC, TiSiC, TiSiO, TiSiCO, TiOC, TiSiN, TiON, TiCN, TiSiCN, TiSiON, TiSiCON, or TiOCN.

14. The method of claim 12, wherein the self-assembled monolayer on the titanium containing hardmask layer provides a water contact angle within a range from about 60° to about 80°.

15. The method of claim 12, wherein the titanium-containing hard mask includes at least about 25 atomic % titanium.

16. The method of claim 12, wherein wet stripping comprises applying an aqueous solution including ammonium hydroxide ($NH_4OH$), hydrogen peroxide ($H_2O_2$), and water ($H_2O$).

17. The method of claim 12, wherein the photosensitive resist layer is lithographically patterned using activating radiation at a wavelength of about 193 nm.

* * * * *